United States Patent
Eran et al.

(10) Patent No.: US 7,486,814 B2
(45) Date of Patent: *Feb. 3, 2009

(54) LOCAL BIAS MAP USING LINE WIDTH MEASUREMENTS

(75) Inventors: Yair Eran, Rehovot (IL); Gad Greenberg, Tel Aviv (IL); Ami Sade, Nahariya (IL); Shirley Hemar, Tel Aviv (IL)

(73) Assignee: Applied Materials, Inc., Santa Clara, CA (US)

( * ) Notice: Subject to any disclaimer, the term of this patent is extended or adjusted under 35 U.S.C. 154(b) by 155 days.

This patent is subject to a terminal disclaimer.

(21) Appl. No.: 11/400,530

(22) Filed: Apr. 10, 2006

(65) Prior Publication Data
US 2006/0251317 A1 Nov. 9, 2006

Related U.S. Application Data

(63) Continuation of application No. 10/322,708, filed on Dec. 19, 2002, now Pat. No. 7,133,549, which is a continuation of application No. 09/286,498, filed on Apr. 5, 1999, now abandoned.

(51) Int. Cl.
*G06K 9/00* (2006.01)
(52) U.S. Cl. ..................................................... 382/144
(58) Field of Classification Search ................. 382/144, 382/145, 181
See application file for complete search history.

(56) References Cited

U.S. PATENT DOCUMENTS

| | | | |
|---|---|---|---|
| 4,818,110 A | | 4/1989 | Davidson |
| 5,475,766 A | * | 12/1995 | Tsuchiya et al. ............ 382/144 |
| 5,563,702 A | | 10/1996 | Emery et al. |
| 5,619,429 A | | 4/1997 | Aloni et al. |
| 5,619,588 A | | 4/1997 | Yolles et al. |
| 5,663,569 A | | 9/1997 | Hayano |
| 5,841,893 A | | 11/1998 | Ishikawa et al. |
| 5,917,934 A | | 6/1999 | Chiu et al. |
| 5,920,067 A | | 7/1999 | Cresswell et al. |
| 5,985,497 A | | 11/1999 | Phan et al. |
| 6,072,897 A | | 6/2000 | Greenberg et al. |

* cited by examiner

*Primary Examiner*—Tom Y Lu
(74) *Attorney, Agent, or Firm*—McDermott Will & Emery

(57) ABSTRACT

A method and apparatus for inspecting a reticle measures line widths using an inspection tool that images the reticle and compares the image with a design database to detect errors in real time. The differences between the line widths of patterns on the reticle and the design database are stored during the inspection procedure. The difference (or "bias") information is then processed off-line to create a map of all the local line-width deviation values (i.e., bias) of every feature on the reticle. The resultant local bias map can be used as a feedback mechanism to improve the reticle manufacturing process, as a "go/no go" criteria for the validity of the reticle, and as a standard report shipped together with the mask to the wafer fabrication facility, where it can be used as a yield-enhancing tool.

37 Claims, 11 Drawing Sheets
(2 of 11 Drawing Sheet(s) Filed in Color)

DATABASE
MEASUREMENT

IMAGE
MEASUREMENT

DB - IMAGE
OVERLAY

LOCAL BIAS MAP USING LINE WIDTH MEASUREMENTS

RELATED APPLICATIONS

This application a continuation of application Ser. No. 10/322,708, filed on Dec. 19, 2002 now U.S. Pat. No. 7,133,549, which is a continuation of application Ser. No. 09/286,498, filed on Apr. 5, 1999 now abandoned, the disclosures of which Applications are incorporated by reference herein.

FIELD OF THE INVENTION

The present invention relates to a method for monitoring the production of photolithographic reticles used in the manufacture of semiconductor devices, and more particularly for inspecting reticle. The invention has particular applicability for in-line inspection of reticles with submicron design features.

BACKGROUND ART

Current demands for high density and performance associated with ultra large scale integration require submicron features, increased transistor and circuit speeds and improved reliability. Such demands require formation of device features with high precision and uniformity, which in turn necessitates careful process monitoring.

One important process requiring careful inspection is photolithography, wherein masks or "reticles", are used to transfer circuitry patterns to semiconductor wafers. Typically, the reticles are in the form of pattern chrome over a transparent substrate, and a series of such reticles are employed to project the patterns on to the wafer in a preset sequence. Each photolithographic reticle includes an intricate set of geometric patterns corresponding to the circuit components to be integrated onto the wafer. Each reticle in the series is used to transfer its corresponding pattern onto a photosensitive layer (i.e., a photoresist layer) which has been previously coated on a layer, such as a polysilicon or metal layer, formed on the silicon wafer. The transfer of the reticle pattern onto the photoresist layer is conventionally performed by an optical exposure tool such as a scanner or a stepper, which directs light or other radiation through the reticle to expose the photoresist. The photoresist is thereafter developed to form a photoresist mask, and the underlying polysilicon or metal layer is selectively etched in accordance with the mask to form features such as lines or gates.

It should be appreciated that any defect on the reticle, such as an extra or a missing chrome may transfer onto the fabricated wafer in a repeated manner. Thus, any defect on the reticle would drastically reduce the yield of the fabrication line. Therefore, it is of utmost importance to inspect the reticles and detect any defects thereupon. The inspection is generally performed by an optical system, such as the RT43200™ or ARIS-i™ reticle inspection systems available from Applied Materials of Santa Clara, Calif.

Basically, three inspection methods are available, die-to-database, die-to-die, and reflected-to-transmitted. In the mask shop, i.e., where the masks and reticles are produced, typically the die-to-database method is used, where the inspection system is used to scan the mask and compared the obtained image to the database used to create the mask. Any difference between the image and the database is flagged as a suspect location. On the other hand, in the wafer fabrication plant, 'the die-to-die method is more prevalent, where the inspection system is used to Scan the mask and compare the image obtained from one die on the mask to another die on the same mask. Any difference between both images is flagged as a suspect location. In a reflected-to-transmitted inspection, the system is used to scan the', mask, and an image obtained from transmitted light is compared to image obtained from reflected. light. In either case, the resulting-output is an indication of all the locations on the reticle suspected to have a defect thereupon. Such an output is generally known in the industry as a defect map.

Another aspect of semiconductor wafer fabrication is the design rule. These design rules define, e.g., the space tolerance between devices and interconnecting lines and the width of the lines themselves, to ensure that the devices or lines do not overlap or interact with one another in undesirable ways. The design rule limitation is referred to as the critical dimension ("CD"), defined as the smallest width of a line or the smallest space between two lines permitted in the fabrication of the device. The CD for most ultra large scale integration applications is on the order of a fraction of a micron.

As design rules shrink and process windows (i.e., the margins for error in processing) become smaller, measurement of reticle features is becoming increasingly important, since even small deviations of line widths from design dimensions may adversely affect the performance of the finished semiconductor device. Conventionally, a critical dimension scanning electron microscope (CDSEM), such as the VeraSEM™, available from Applied Materials of Santa Clara, Calif., is used to measure line widths. However, due to the slow operation of CD-SEM's, only selected locations (generally about 25) are examined, and statistical analysis is used to determine the quality of the CD over the entire reticle or wafer. The sample sites are usually located in areas on the reticle likely to have deviations, and are selected based on the experience of the user and/or statistical techniques.

As can be appreciated, the usefulness of CD-SEM inspection of reticle CD depends, to a great extent, on the ability to predict which sites on the reticle contain variations. Moreover, the number of CD-SEM sample sites is typically limited, since inspection time for each site is considerable. Thus, significant but. unobvious CD errors may go unnoticed during inspection, such as "global" errors causing CD variations across the reticle, which indicate reticle manufacturing problems; e.g., a greater CD deviation in the features in the center of the reticle than in features at the perimeter of the reticle.

Recently, Applied Materials has introduced in its RT-8000 ml series and ARIS-i reticle inspection systems a new feature, called Line Width Error Detector ("LWED"). In addition to the normally reported defects, as explained above, this feature allows the system to report another type of defect, namely line width errors. Specifically, the LWED compares the feature sizes of the reticle under inspection with feature sizes from a design database to determine any width deviation from the data base. An example of a feature width difference defect that can be discovered by the LWED is shown in FIG. 1. Any deviations discovered by the LWED are reported on the defect map as locations suspected of having defects thereupon.

It can be appreciated from the above that the LWED somewhat bridges the previously distinct issues of defect detection and CI) inspection. Such bridging may be very beneficial to the wafer fabrication process. Specifically, perhaps the biggest technology issue in advancing optical lithography to smaller design rules is the Mask Error Factor 'MEF' a.k.a. mask error enhancement factor "MEEF". This factor accounts for the observation that small variations in CD on the mask can cause large variations on the wafer at sub-wavelength resolution. Therefore, there exists a need for a simple, fast, and cost-effective methodology for inspection of CD errors over the entire reticle, in addition for inspecting the reticle for defects.

SUMMARY OF THE INVENTION

The present invention provides a solution for the need to inspect the entire reticle for CD deviations in addition to defect inspection. Two notable advantages of the invention are that: 1. it monitors CD over the entire reticle, and 2. it has no associated costs in terms of throughput, i.e., CD monitoring is done "on the fly" as the system inspects the reticle for defects.

According to a feature of the present invention, as the reticle inspection system scans the reticle for defects, various features on the reticle are being measured and compared against the database. Subsequently, in addition to a detect map, the system output a CD deviations map across the entire reticle. This enables fast and inexpensive method of monitoring the "CD error budget" and early discovery of global issues in manufacturing the reticles. Since the CD is measured using data obtained by the conventional reticle inspection tool during inspection, the results and throughput of the inspection process are not adversely effected.

According to a particular embodiment of the present invention, a database corresponding to the inspected reticle is provided. When the reticle is scanned, the width of each element on the scanned reticle and in the database is measured, and a file of width differences is constructed. Each measured difference (including zero difference) in the file includes its coordinates on the reticle. The file is then used to construct a width difference map. According to one implementation, the width differences are color coded according to their severity. According to another implementation, the severity is indicated by another axis, so that the resulting map is three dimensional.

The invention also provides a new inspection methods, termed by the inventors die-to-design rule. According to this method, no database or. scanning of another die is required. Instead, one or more design rules (CD) are pre-programmed into the system before the inspection begins. For example, 1, 1.6, and 2.25 microns can be pre-programmed: Any measurement on the image of the reticle is then compared to the pre-programmed design rule, rather than to the database or another die.

The pre-programmed design rule can also be used as a filter. According to this embodiment, a threshold, e.g., 15%, is also pre-programmed with the design rules. During inspection, the system measures each width and compares it to the pre-programmed CD's. If the variation is above the 15% threshold, it is assumed that the measurement is of a feature which need not be measured or reported (e.g., 3 micron feature) and the measurement is discarded. Otherwise, the difference is stored in a file and difference maps can be constructed as in the above.

Another feature of the invention is that the user can customize the difference map. For example, the user may indicate that a map of only 1 micron feature width should be constructed. Then, the file of either of the above described systems can be used to construct CD differences of only 1 micron features by using an appropriate threshold. That is, normally there are no "close cases" in reticle design, i.e., normally reticels are not designed to have lines of close measurement, e.g., 0.9, 1, and 1,1 micron. Therefore, using, e.g., a 10% threshold would be sufficient to identify all the sought features.

Additional advantages of the present invention will become readily apparent to those skilled in this art from the following detailed description, wherein only the preferred embodiment of the present invention is shown and described, simply by way of. illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in 7 nature, and not as restrictive.

BRIEF DESCRIPTION OF THE DRAWINGS

The patent or application file contains at least one drawing executed in color. Copies of this patent or patent application with color drawings will be provided by the Patent and Trademark Office upon request and payment of the necessary fee.

Reference is made to the attached drawings, wherein elements having the same reference numeral designations represent like elements throughout, and wherein.

DESCRIPTION OF THE INVENTION

Figure 1:
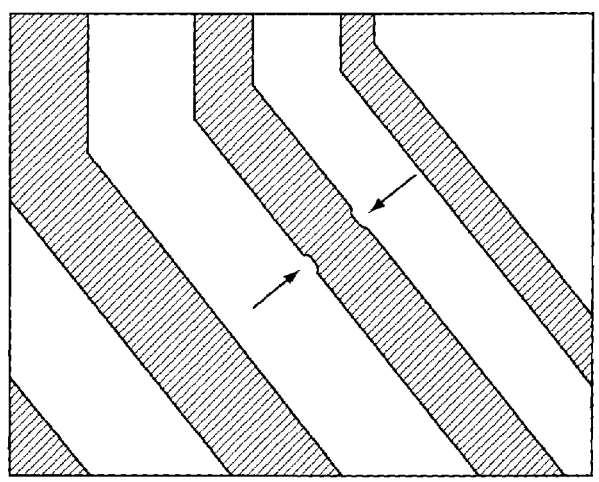
FIG. 1 illustrates a defect in the form of an undersized feature on a reticle.
Figure 2:
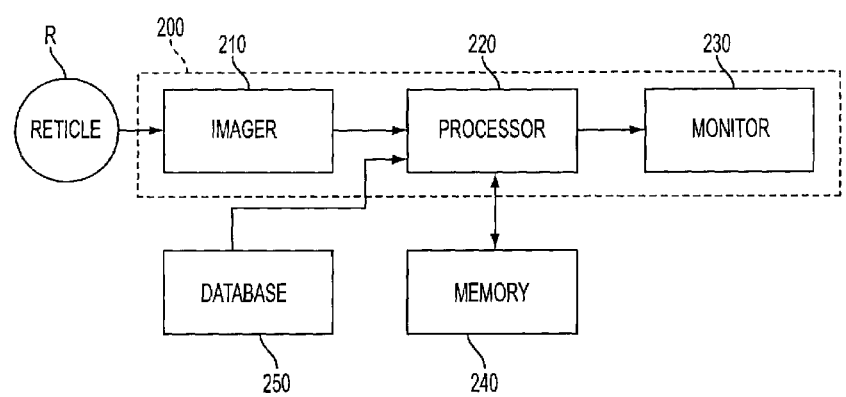
FIG. 2 is a top level block diagram of the system according to an embodiment of the invention.

The present invention is implemented at an inspection tool 200, as shown in FIG. 2, comprising an imager 210 for imaging the surface of a reticle R at high speed, typically using a line or area CCD and an illumination source such as a lamp or a laser. Inspection tool 200 further comprises a processor 220, which preferably performs the analysis disclosed herein electronically, and a monitor 230 for displaying results of the analyses of processor 220. Processor 220 is in communication with a conventional reticle reference design database 250 and a memory device 240. Inspection tool 200 may be a conventional reticle inspection system, such as the RT-8200, ARIS-i, and the inspection tools described in U.S. Pat. No. 5,619,429, entitled "Apparatus and Method For Inspection Of a Patterned Object By Comparison Thereof To a Reference", and U.S. Pat. No. 5,619,588, entitled "Apparatus and Method For Comparing and Aligning Two Digital Representations of an Image" the entire disclosures of which are hereby incorporated by reference.

According to the methodology of the present invention, a reticle is imaged and the processor 220 compares the image with a design database to detect defects in real time. According to the preferred embodiment, the LWED is used to detect variations in widths of features on the reticle and create a CD error map. The LWED and its operation are fully described in co-pending application Ser. No. 08/933,104, attorney docket 22121 PDC which is incorporated herein by reference. Specifically, the x,y edges of each of the image pixels, i.e., the CCD pixels, is divided into data sub-pixels, e.g., 6 or 32 data sub-pixels. Thus, each $\frac{1}{6} \times \frac{1}{6}$, or $\frac{1}{32} \times \frac{1}{32}$ data sub-pixels forms a measure unit. Then, each feature on in the image and database is measured per measure units. An exemplary measurement is depicted in FIGS. 3a-3c.

Figure 3A:
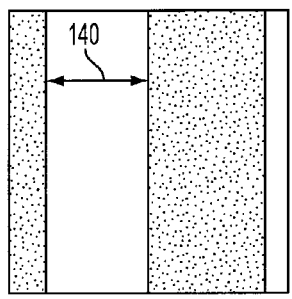
FIG. 3a-3c exemplify measurements of image and database feature widths.
Figure 3B:
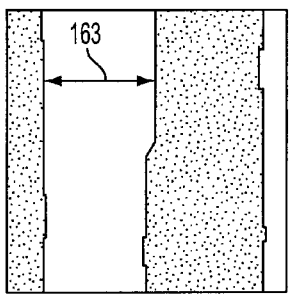
Figure 3C:
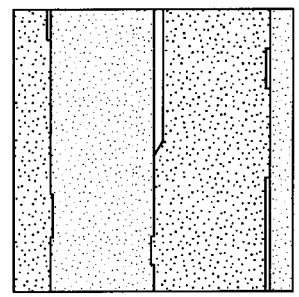

In the example of FIG. 3a, a database measurement of 140 units was obtained, while in FIG. 3b a measurement of 163 units was obtained for the image. A database over image overlay is also depicted in FIG. 3c to exemplify the differences. It should be appreciated that depending on the system's optics and resolution, a measure unit may correspond to various absolute measurement which can be determined and calibrated for each system. Additionally, it should be appreciated that while in the preferred embodiment each image pixel is divided into a 6×6 or more preferably 32×32 data sub-pixels, the image pixels need not be divided, or may divided into other sizes of sub-pixels. However, the division to sub-pixels increases the resolution and when high resolution is needed, small sub-pixels should be used.

Figure 4:
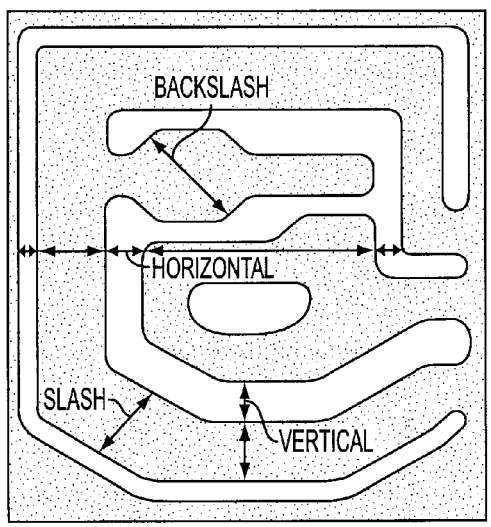
FIG. 4 exemplifies the four measurement directions utilized in the preferred embodiment.

In the preferred embodiment, four measurement directions are provided: horizontal, vertical, slash, and back-slash. These are depicted in FIG. 4, and are used to cover the various orientations generally provided on reticles. Of course, if technology progresses to include other directions on the reticles, other measurements directions may be used. Also, in the preferred embodiment, three different sets of measurements are used for comparison with the data base: (1) a single measurement taken between two edges; an average of three measurements, i.e., the measurement corresponding to (1) averaged with two adjacent neighboring measurements; and (3) average of five measurements, i.e., the measurement of (3) with two additional neighboring measurements. These are referred to herein as Chain 1, Chain 3 and Chain 5 measurements, respectively. This averaging is advantageous to reduce edge roughness resulting from the imaging and digitizing systems.

Each differences between the measured CD of patterns on the reticle and the design database are. stored during the inspection procedure, together with the corresponding coordinates. The difference (or "bias") information is then used to create maps of the CD variation of the entire reticle (sometimes referred to herein as the "Local Bias Map" or "LBM"). Thus, the present invention utilizes the fact that the inspection tool measures distances between all pattern edges on the reticle to gather all the local CD deviation values (i.e., bias) of every feature on the reticle. The resultant map, referred to as a "local bias map", can be used as a feedback mechanism to improve the uniformity and quality of the reticle manufacturing process, as a basis for selecting meaningful sites for further inspection at a CD-SEM, as a quality control tool to detect, locate and measure critical CD deviations which may ruin the final printed wafer, thus providing "go/no go" indicator for reticle delivery to the wafer fabrication facility, and as a standard report shipped together with the mask to the wafer fabrication facility, where it can be used to optimally adjust the wafer printing tools to enhance yield.

Figure 5:
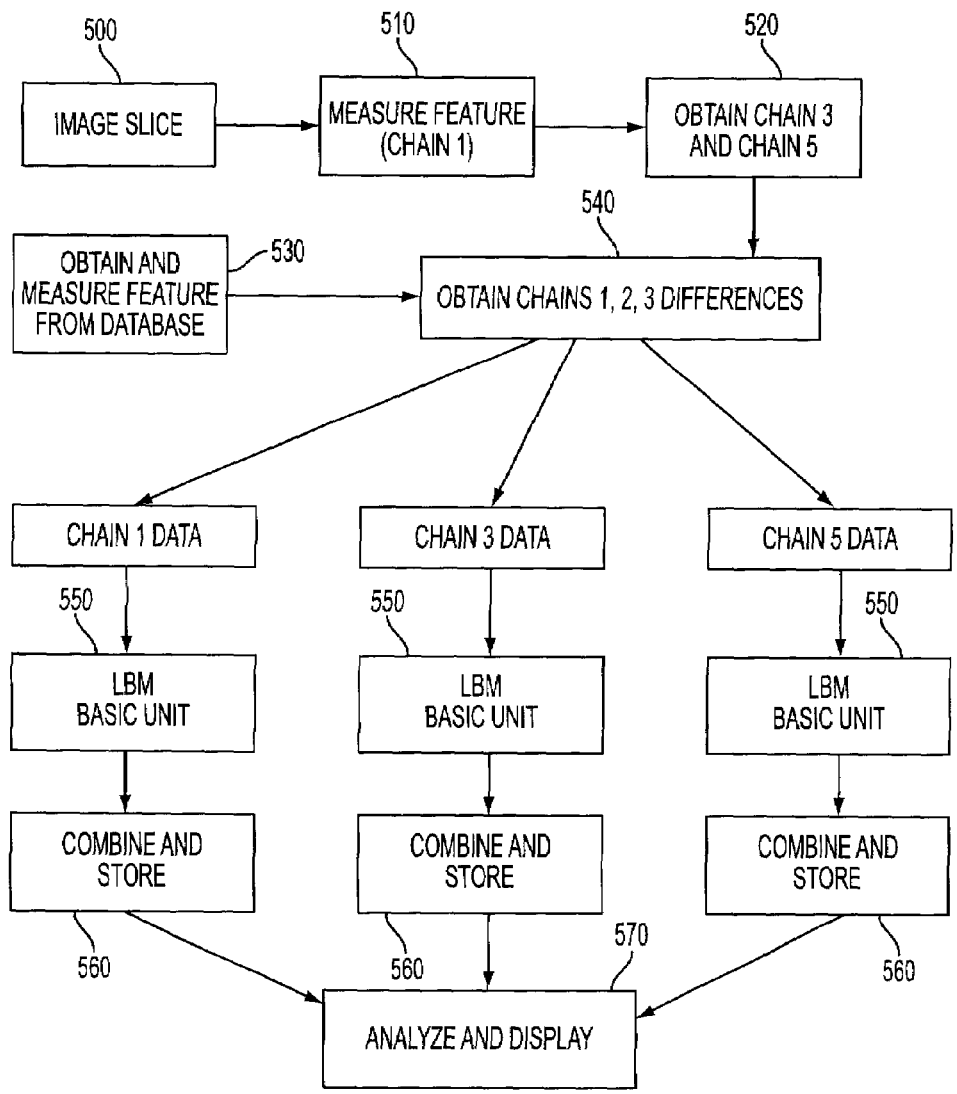
FIG. 5 is a block diagram of the preferred embodiment of the present invention.

The preferred embodiment of the present invention will now be described with reference to FIG. 5. Specifically, in block 500, a slice of the reticle is imaged (it should be appreciated that the imaging can be done for defect inspection purposes concurrently). Then, in block 510, a feature is selected and its width measured (Chain 1), preferably and when possible, in the four measure directions concurrently. The corresponding feature is fetched from the database and its width measured in block 530. In block 520 Chain 3 and Chain 5 are obtained, i.e., an averages of the feature width and its two and four neighbors, respectively.

It should be appreciated that the measurement of the feature from the database can be taken only once (i.e., Chain I only), since the database is presumably less "noisy" than the image. However, it is just as easy to also obtain Chain 3 and Chain 4 from the database. In such a case, each image Chain should be analyzed with respect to the corresponding database Chain.

In block 540 difference values are obtained for chains 1, 3, and 5, either using a single database value or using corresponding database chain values. Data pertaining to each chain is then sent to the LBM basic unit 550. The data of each difference value includes its coordinates, direction (horizontal, vertical, slash or backslash), polarity (corresponding to glass or chrome), and the length of the feature as measured in the database. Each LBM Basic Unit processes the data and sends it to the analysis and storage blocks 560. The processing of the LBM Basic Unit includes, for example, filtering according to pre-programmed criteria. According to one example, each difference value is compared to a pre-programmed Delta Max value to filter out erroneous measured differences caused by, for example, misregistration or pattern defect. According to another example, each difference value is compared to a pre-programmed design rule and threshold range. If the difference value falls outside the threshold range, it is discarded as of no interest. This filtering is particularly useful when monitoring a particularly sensitive CD, while ignoring all other insensitive ones.

At this point is should be noted that the LBM basic unit 550 need not work with single values. That is, depending on the feature size, the image sampling rate, and the buffering of the chain data, in many cases it is possible to have more than one width value for a particular feature. Therefore, the LBM basic unit 550 may be programmed to sample the chain data so that it obtains average of width value, rather than a single value. This would further help reducing the noise in the scanned image. Preferably, the LBM basic unit 550 is provided with a threshold value for sampling, so that it can check whether the number of measurements in a particular area justifies averaging to reduce noise.

The output of the LBM Basic Unit sent to the analysis and storage block 560 is in the form of a log file having sub sections. Each subsection stores difference data according to their characteristics, i.e., direction, polarity, and length. Thus, the values can be analyzed and displayed according to particular characteristics, as desired by the user. For example, the user may decide to ignore all vertical measurements, or to limit display only to a specified, e.g., 1 micron, feature length, or to designate a different feature length for each chain. However, in the preferred embodiment, certain analysis of the map is performed automatically by the analysis and display unit 570, so as to assist the user in interpreting the map. For example, unit 570 may perform certain analysis to point the user to locations on the map the user should zoom into in order to obtain important information. The unit 570 can provide the user, for example, with list of areas on the map suspected of being degraded, so that the user may further investigate those areas. The list may consist ol for example, areas having high variability of bias. Other types of statistical analysis may be performed, such as, for example, areas of high sigma, high peak-to-peak bias values, etc. Such analysis is helpful in assisting the user understand the information provided in the LBM.

Figure 6:
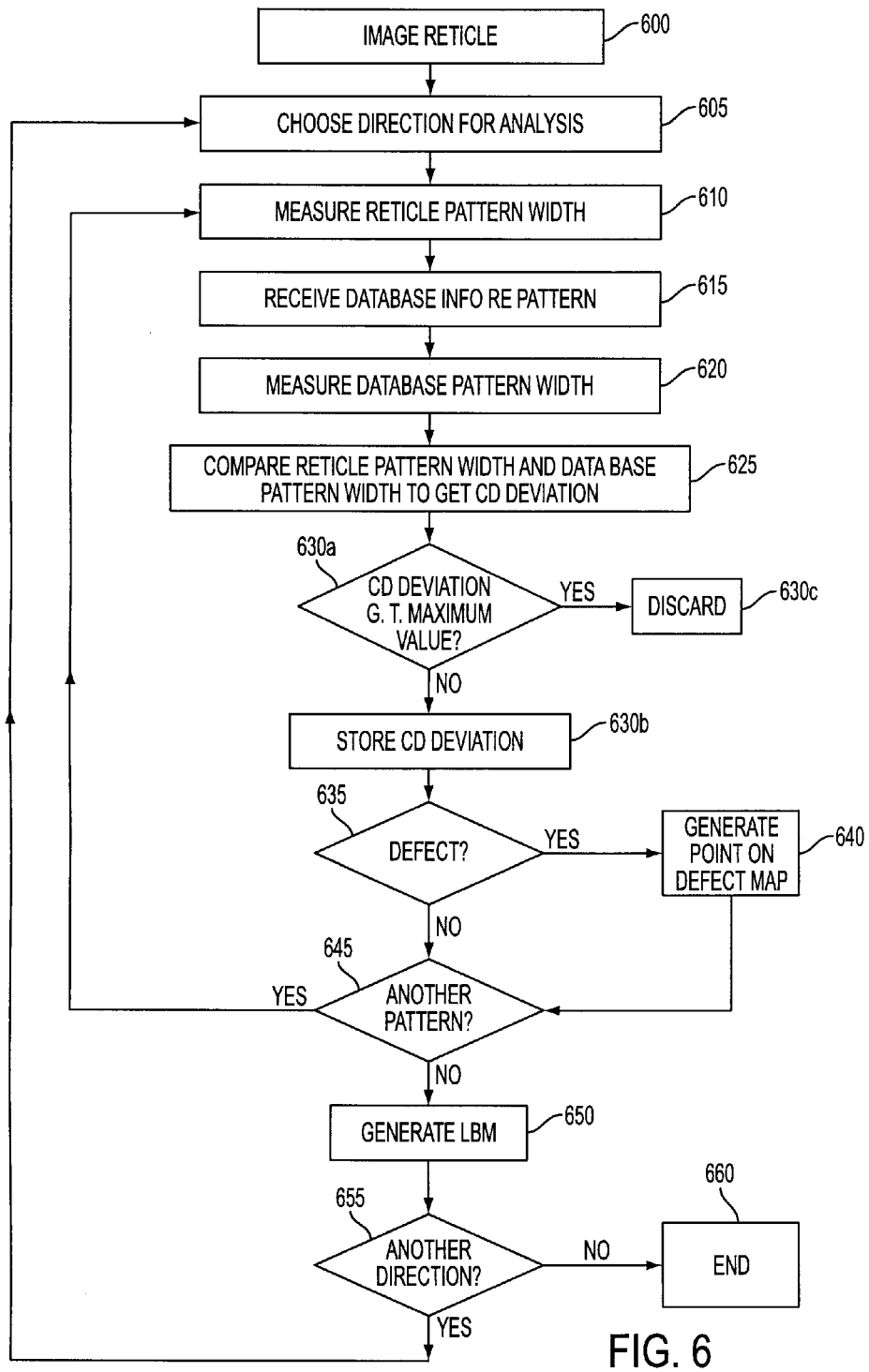
FIG. 6 is a block diagram that illustrates an embodiment of the invention.

Referring now to FIG. 6, an exemplary process flow of another embodiment according to the invention is provided.

Figure 7:
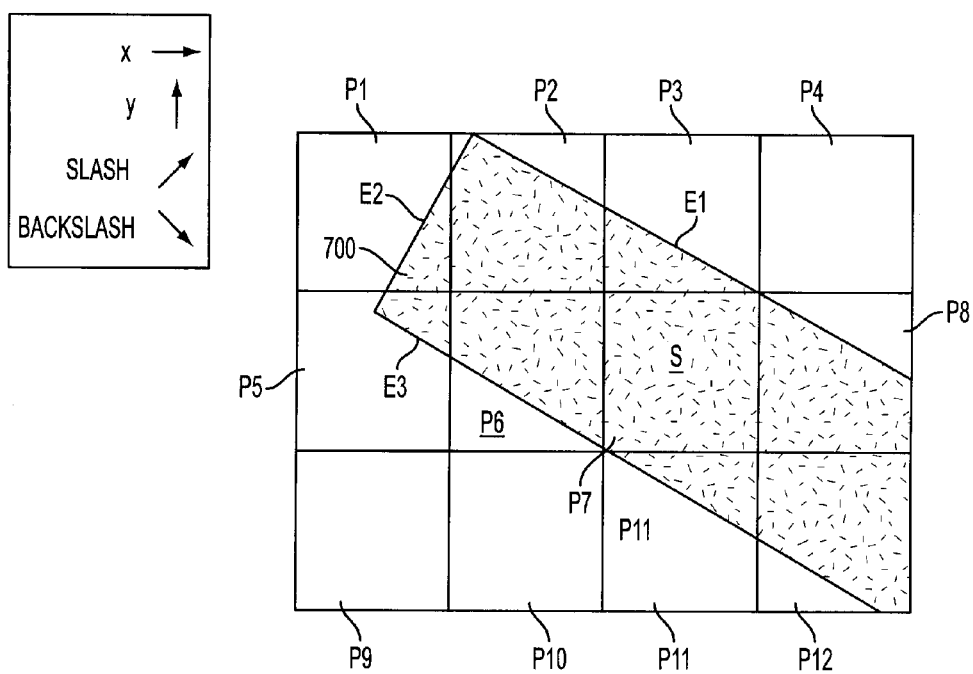
FIG. 7 illustrates a 4 by 3 span of an environment of feature pixels used in practicing an embodiment of the present invention.

At step 600 in FIG. 6, reticle R is imaged by imager 210 in a conventional manner and the image is received by processor 220, which processes the image as a plurality of data elements called here "image pixels". An exemplary array of pixels P1-P12, which represent a reticle feature or "pattern" 700, is illustrated in FIG. 7. As explained above, in the preferred embodiment each of the pixels P1-P12 is subdivided into data sub-pixels, such as to 32 sub-pixels on a side to form a 32×32 matrix. Pattern 700 has edges E1-E3 and a surface S.

Next, the width of pattern 700 is "measured" by processor 220 at step 610 using the LWED. Typically, reticles are made of chrome patterns, such as pattern 700, on a transparent glass surface. When imaged with transmitted light, the glass which transmits lights is seen as white and the chrome which blocks the light (i.e., pattern 700) is seen as black. Line width measurements are taken, as by the LWED, on both black and white features, and each measurement is assigned a "polarity" depending on whether it is white or black. However, in this embodiment, the direction measurement is done serially and a measurement direction for all patterns on the reticle must first be chosen at step 605, either automatically or by the user. As in the previous embodiment, the line width measurement is performed independently in up to four directions in the patterns. In other words, up to four separate measurements are made, by analyzing the data sub-pixels in four different directions and sequences, although the reticle needs to be imaged (as by a line or area CCD) only once.

Referring to FIG. 7, line width measurement is made horizontally (in the direction of arrow x), vertically (in the direction of arrow y), in a slash direction or in a backslash direction. The plurality of line width measurement directions is necessary because different line width information is gathered in each direction during the inspection. This happens because during manufacture (or "writing") of the reticle, different errors occur in different directions in the written patterns. Furthermore, the line width measurement techniques employed in this embodiment of the present invention are most effective when measuring the distance between parallel edges; e.g., between edges E1 and E3. Thus, it is preferred to measure in diagonal directions (slash and backslash) as well as orthogonally.

After a width measurement of pattern 700 is completed in the chosen direction, processor 220 receives pixel data from design database 250 corresponding to pattern 700 (see step 615), and performs a width measurement of the reference design data, which is substantially defectless, in the chosen direction (see step 620). Processor 220 then compares the width measurements from steps 610 and 620 to produce a CD difference value (see step 625), which is positive or negative depending on whether the width of pattern 700 is larger or smaller than the design width. In the preferred embodiment, steps 610, 620, and 625 are performed for chain 1, 3, and 5, as explained above with reference to FIG. 5. The CD difference value represents the deviation of pattern 700's CD from the reference design data.

The CD difference value is checked for validity by processor 220 at step 630a and, if valid, is stored in memory 240 at step 630b, along with its location on the reticle, polarity, feature size, and direction. If invalid, it is discarded at step 630c. The validity of the CD difference value is determined by comparing it with a maximum difference value. The maximum difference value is determined for each measurement based on the polarity and size of feature 700 and the direction of measurement, based on predetermined criteria which indicate that the CD difference value is too large because of line width defects or because of a mismatch between the image and the database that causes the measurements of non-corresponding features to be subtracted from each other. If multiple sets of CD difference values were created, as by chaining, each calculated CD difference value is evaluated separately at step 630a, and each set is stored separately at step 630b.

The inspection procedure of steps 615-625 described above, utilizing reference design database 250, is known as a "die-to-database" inspection; i.e., an inspection comparing the reticle under inspection with the data used to write the reticle. However, those skilled in the art will recognize that, instead of comparing reticle R with design database 250, it can readily be compared with another die on the same reticle instead, which was previously imaged by imager 210. Such a procedure is known as a "die-to-die" inspection.

Next, at step 0.635, processor 220 determines in a conventional manner whether the CD difference value represents an acceptable error or a defect, as by using measurement quality grading and/or other predetermined criteria. If a defect is found to exist, it is mapped in a conventional manner on a defect map (i.e., a map showing the location of defects) at step 640, and displayed on monitor 230. Whether or not a defect is found, at step 645 the next pattern on the reticle is selected, then measured in the chosen direction, and compared with a reference pattern by repeating steps 610 to 645.

After all patterns on the reticle have been measured in the chosen direction, processor 220 generates a "local bias map" (LBM), described in greater detail below, by plotting all the CD deviations according to their location on the reticle, and displays the LBM on monitor 230 (see step 650). Of course, if multiple sets of CD difference values were created, as by chaining, each set can be used to produce a separate LBM. Moreover, different maps can be created separately for different absolute CD as designated by the user.

At step 655, it is determined whether width measurements are to be taken in another direction; e.g., if a difference in bias (i.e., CD deviation) is expected between the four different directions because of the properties of the writing tool used to produce the reticle, characterizing this difference may assist the mask shop in improving the writing tool calibration and performance. If width measurements are not to be taken in another direction, the inspection ends at step 260. Otherwise, another direction is chosen at step 605, and the measurement, comparison, and mapping process of steps 610 to 650 is repeated.

The LBM provides information not available from the previously generated defect map of step 640. The sole purpose of the defect map is to indicate the location on the reticle suspected of having a defect thereupon. As is well known in the art, such a defect can be a missing or extra pattern, a pin hole, a particle, etc. On the other hand, the LBM provides the user an immediate access to discover problems concerning the CD accuracy. The LBM plots the CD deviation at every point on the reticle, providing the user with a picture of the CD variation across the entire reticle. Other values, such as the average value and standard deviation of CDs across the entire reticle or in specific parts or patterns on the reticle can also be easily calculated and plotted using the data obtained from the LBM Basic Unit. Thus, identification of the regions of the reticle having the largest and smallest CD variation are easily obtained. Furthermore, large scale global phenomena such as gradual radial or linear change in CD variations across the reticle, which may indicate reticle processing problems, can be detected and measured, and local variations in bias are mapped. Alternatively, only variations that exceed pre-determined thresholds can be mapped.

Moreover, the additional valuable information provided by the LBM, which information is not provided by conventional inspection methods, is obtained using data gathered by the inspection tool during the regular reticle inspection. Thus, the present invention generates the LBM "on the fly" without adversely affecting the regular inspection and without an increase in inspection time.

Figure 8A:
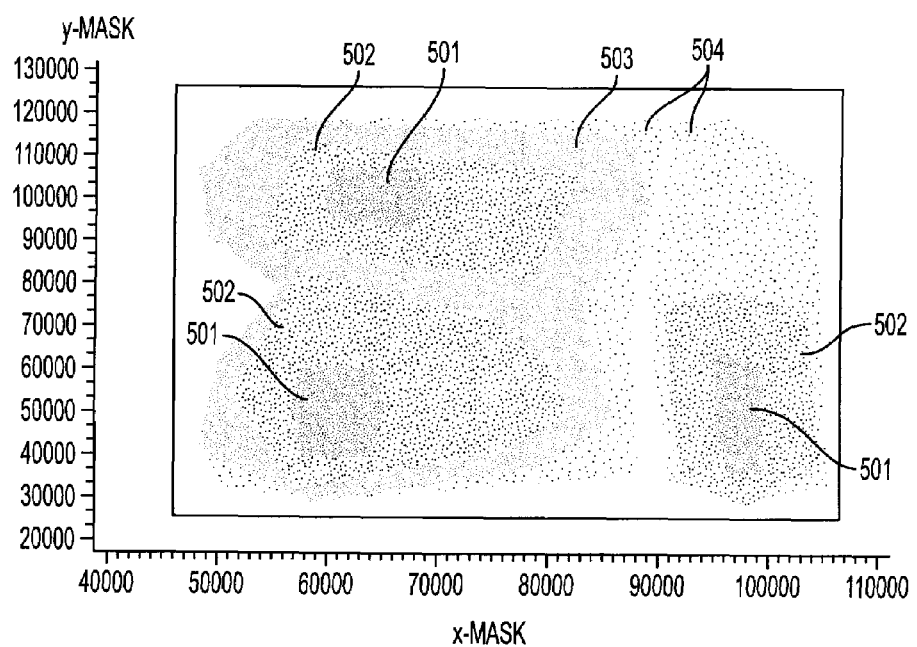
FIG. 8A-8D are local bias maps according to embodiments of the present invention.

Regarding the LBMs, in one embodiment of the present invention, the LBM is created by assigning each difference into one of a plurality of groups based on the magnitude of the CD difference. Each such group has a particular color associated therewith. Thus, each CD difference is displayed as a data point on a two-dimensional graph in the color of its assigned group, wherein coordinates of the graph represent the location on the reticle. An example of such an LBM is shown in FIG. 8A, wherein the darkest gray regions 501 represent areas in which the local CD deviations are the greatest. For example, the darkest gray 501 correlates to about 100 nm CD deviations. The other gray zones 502, 503, 504 represent areas in which a CD deviation exists, but in smaller magnitudes. The gray decreases in darkness down to the white area 505, which has virtually no CD deviations.

Figure 8B:
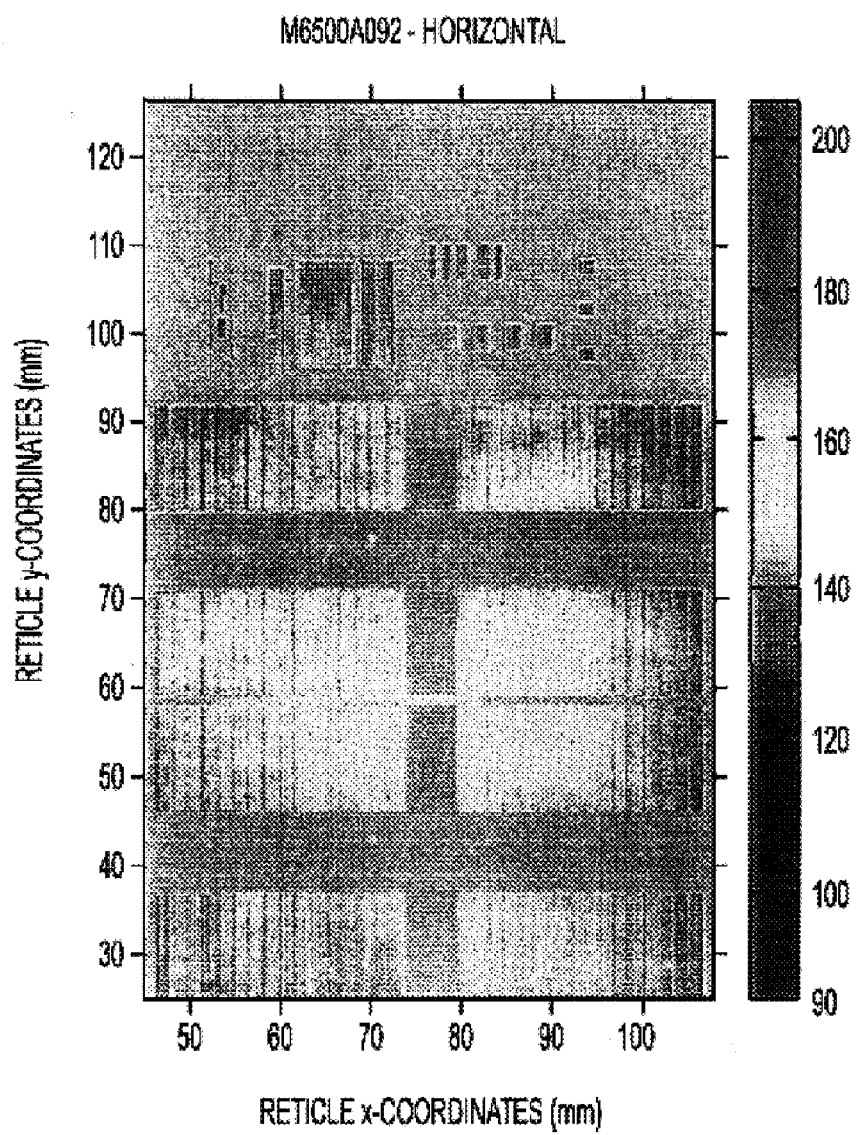
Figure 8C:
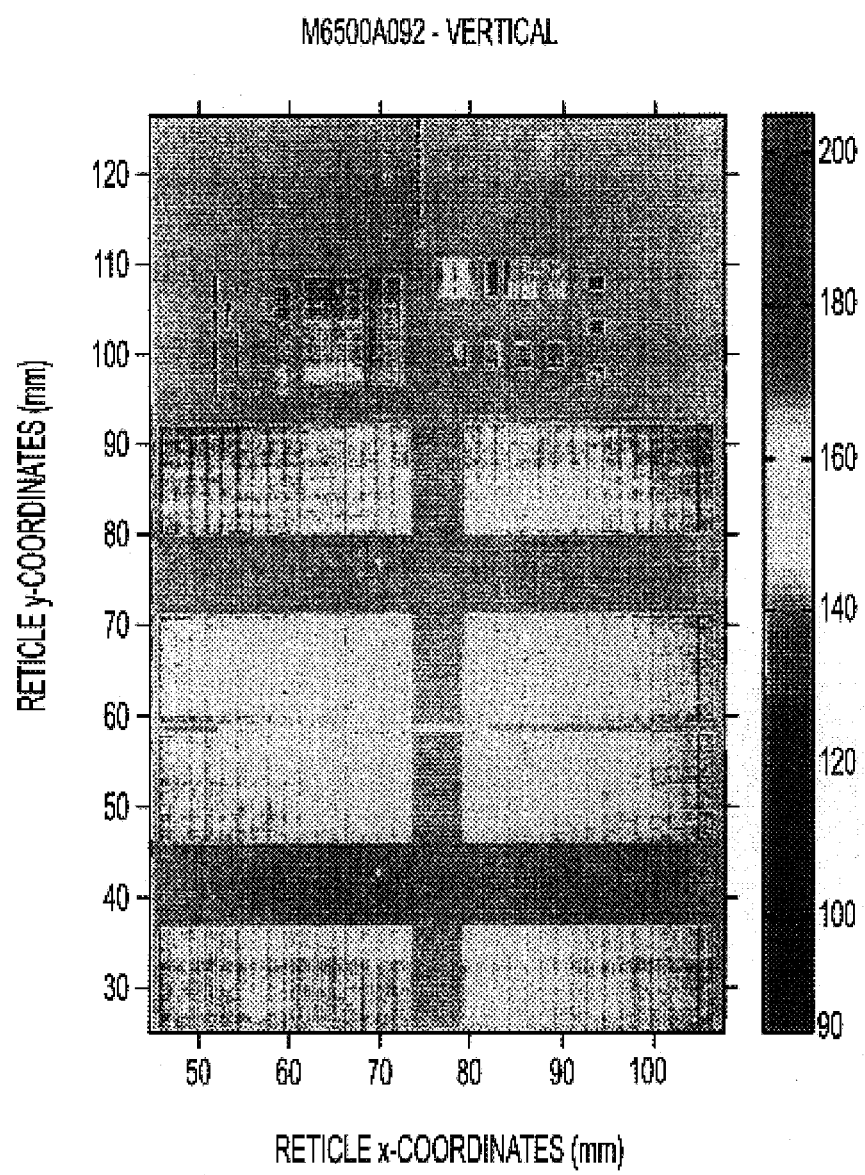

Another example of such a two-dimensional LBM is shown in FIGS. 8B and 8C, wherein red indicates high bias (i.e., CD difference values with high magnitudes), blue indicates low bias, green indicates the average bias measured across the reticle, and gray indicates areas where no measurements were available, due to lack of data or features that are too small or not selected. The color bar to the right of each map serves as a legend, indicating the magnitude differences, in nanometers, represented by the colors. FIG. 8B is the result of CD measurements taken in the horizontal direction (in the direction of arrow x in FIG. 4), and FIG. 8C is the result of CD measurements in the vertical direction (in the direction of arrow y in FIG. 7). Differences between the two maps, readily seen in the upper part of the maps, are due to thin, elongated features measurable in one direction only. An effect evident from both maps is a global CD variation that causes the bias of the features in the center of the reticle to be somewhat higher than the bias of features at the perimeter of the reticle.

Figure 8D:
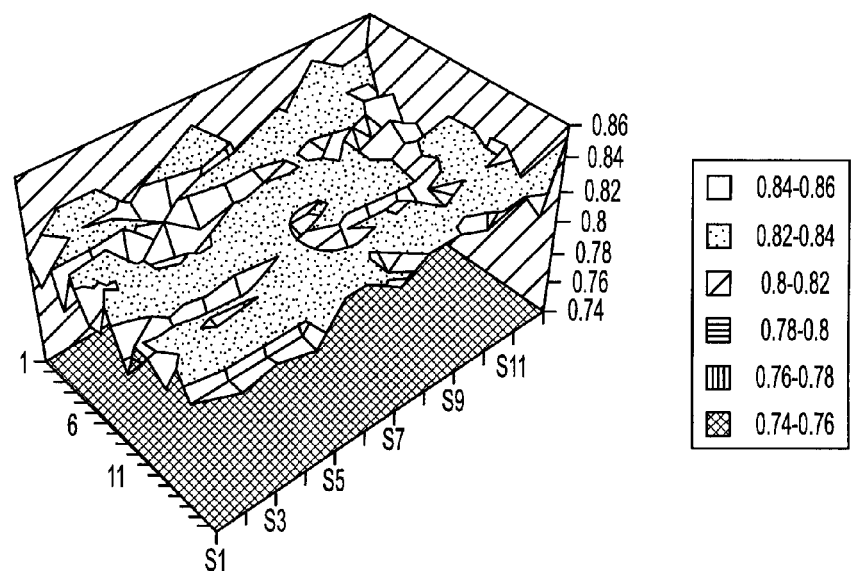

In another embodiment of the present invention, illustrated in FIG. 8D, the LBM displays each CD difference to be mapped as a data point on a three-dimensional graph having an x-axis, a y-axis and a z-axis, wherein the x and y axes of the graph represent the location on the base associated with target and reference data elements from which each respective CD difference to be mapped was calculated, and the z-axis represents a numerical value of the difference.

Since the present invention enables CD variations to be logged independent of the sensitivity of the regular inspection process, the user can monitor CD variations; e.g., line-width variations, which are very small but above an allowed tolerance, yet cannot be detected with conventional inspection methods. The monitoring of such regional CD errors can be facilitated by magnifying or "zooming in" on a particular part of the LBM, if desired. As noted above, the areas selected for zooming can be indicated by the unit 570 according to various statistical analysis of the bias data.

In an alternative embodiment of the invention, at step 250, the user can request that an LBM be generated showing differences (i.e., line-width variations) related only to features having a particular design width. Typically, reticles contain patterns, such as lines, having several different design widths; for example, 1 μm, 2 μm and 5 μm. However, the user may be interested in monitoring the CD variation of lines of only one of these widths. For example, the writing tool used to produce the reticle is usually optimized to a single line width; e.g., 1 μm. To control the writing process quality, the user can obtain an LBM file for 1 μm lines separately from lines of other width, allowing the mask shop to check the writing tool calibration and to check the deviation of the tool away from the 1 gm design width. Furthermore, some lines are more sensitive to CD errors than other lines, and the acceptable error of features of different widths may be different.

By generating an LBM of CD differences of features of only a single design width, the user can quickly monitor the quality of these features and take early corrective action and/or reject a reticle exhibiting overly large variations in these features. Additionally, this embodiment of the present invention enables the user to observe global errors indicating writing or processing problems, such as a difference in error concentration from the center to the outside of the reticle, for several different design widths separately. To facilitate generating single line-width LBMs, the differences for features of different design widths can be stored in separate storage devices at step 630, or in separate parts of memory 640. Moreover, each particular design rule can be assigned to a particular chain, depending on the control required.

In a further embodiment of the present invention, after generation of the LBM at step 650, the sum of the largest negative magnitude and largest positive magnitude of all the CD difference values is calculated to produce a "peak-to-peak" difference value. This peak-to-peak difference is then compared to a predetermined threshold peak-to-peak difference value, and the reticle is disqualified (i.e., rejected) if the calculated peak-to-peak difference value is greater than the threshold value. Thus, the present invention enables a "go-no go" test for the reticle that is superior to prior art test methodology of this type. Prior art tests typically employ statistical methods such as measuring a number of points (e.g., 25 points) on the reticle with a CD-SEM and performing a peak-to-peak analysis based on those points. The peak-to-peak analysis of this embodiment of the present invention is more accurate because it uses information gathered from every pattern on the reticle, not from a sampling of a relatively small number of points on the reticle.

According to yet another embodiment of the invention, a novel die-to-design rule inspection method is provided. This method can be used in addition to, or instead of the die-to-database and die-to-die methods. Specifically, according to this embodiment, one or more "absolute" CD data are programmed and stored as the reference design rule values. These may or may not be entered together with a threshold range, for example 1 and 1.6 microns CD value with a 10% threshold range. According to the die-to-design rule method, rather than comparing each measure feature to a database or another die, it is compared to the absolute design rule stored in the system. Any differences between the measured feature and the programmed design rule are noted as bias. As with the above embodiments, the comparison can be done for Chain 1, Chain 3 and Chain 5, each against the programmed design rule. Moreover, when several design rules are used, each Chain may be assigned to handle a particular design rule.

According to further embodiment, the threshold is used as a filter. Specifically, each measurement is compared against the range provided by the threshold. If the measurement is outside the range, e.g., below 0.9 or above 1.1 microns for the 1 micron value and below 1.44 or above 1.76 for the 1.6 micron value for 10% threshold, it is discarded as of no interest. Otherwise, the system may follow one of two options: 1. calculate a difference between the measured CD and the measured CD of the corresponding feature in the database, or 2. calculate a difference between the measure CD and the absolute value. Either calculated difference can be used to create the LBM as explained above.

Figure 9:
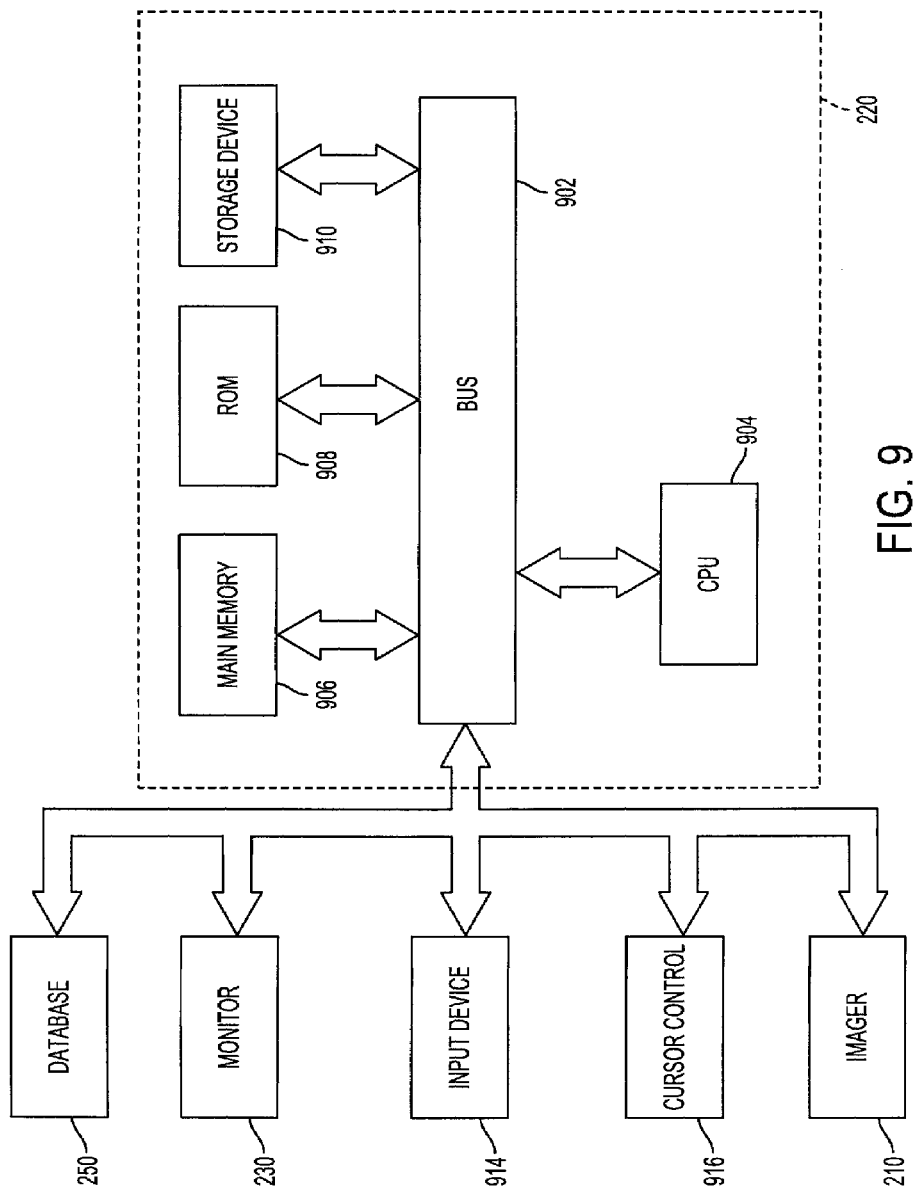
FIG. 9 is a block diagram that illustrates an embodiment of the invention.

FIG. 9 is a block diagram that illustrates an embodiment of the invention shown in FIG. 2. According to this embodiment, processor 220, as shown in FIG. 2, includes a bus 902 or other communication mechanism for communicating information, and a central processing unit (CPU) 904 coupled with bus 902 for processing information. Processor 220 also includes a main memory 906, such as a random access memory (RAM) or other dynamic storage device, coupled to bus 902 for storing information and instructions to be executed by CPU 904. Main memory 906 also may be used for storing temporary variables or other intermediate information during execution of instructions to be executed by CPU 904. Processor 220 further includes a read only memory (ROM) 908 or other static storage device coupled to bus 902 for storing static information and instructions for CPU 904. A storage device 910, such as a magnetic disk or optical disk, is coupled to bus 902 for storing information and instructions.

Storage device 910 may also serve as memory 240 in FIG. 2.

Processor 220 is coupled, as via bus 902, to monitor 230 (FIG. 2), such as a cathode ray tube (CRT), for displaying information to the user. An input device 914, including alphanumeric and other keys, is coupled to bus 902 for communicating information and command selections to CPU 904. Another type of user input device is cursor control 916, such as a mouse, a trackball, or cursor direction keys for communicating direction information and command selections to CPU 904 and for controlling cursor movement on monitor 930.

Imager 210 (FIG. 2) inputs data representative of images of a reticle under inspection, as discussed above, to bus 902. Such data may be stored in main memory 906 and/or storage device 240, and used by CPU 904 as it executes instructions. Imager 210 may also receive instructions via bus 902 from CPU 904. Likewise, database 250 (FIG. 2) inputs data representative of a substantially defectless reticle, as discussed above, to bus 902. Such data may be stored in main memory 906 and/or storage device 240, and used by CPU 904 as it executes instructions.

The invention is related to the use of processor 220 for inspecting the surface of a reticle. According to an embodiment of the invention, inspection of the reticle is provided by processor 220 in response to CPU 904 executing one or more sequences of one or more instructions contained in main memory 906. Such instructions may be read into main memory 906 from another computer-readable medium, such as storage device 910. Execution of the sequences of instructions contained in main memory 906 causes CPU 904 to perform the process steps described above. One or more processors in a multi-processing arrangement may also be employed to execute the sequences of instructions contained in main memory 906. In alternative embodiments, hard-wired circuitry may be used in place of or in combination with software instructions to implement the invention. Thus, embodiments of the invention are not limited to any specific combination of hardware circuitry and software. The programming of the apparatus is readily accomplished by one of ordinary skill in the art provided with the flow chart of FIG. 6.

The term "computer-readable medium" as used herein refers to any medium that participates in providing instructions to CPU 904 for execution. Such a medium may take many forms, including but not limited to, non-volatile media, volatile media, and transmission media. Non-volatile media include, for example, optical or magnetic disks, such as storage device 910. Volatile media include dynamic memory, such as main memory 906. Transmission media include coaxial cable, copper wire and fiber optics, including the wires that comprise bus 902. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, or any other medium from which a computer can read.

Various forms of computer-readable media may be involved in carrying out one or more sequences of one or more instructions to CPU 904 for execution. For example, the instructions may initially be borne on a magnetic disk of a remote computer. The remote computer can load the instructions into its dynamic memory and send the instructions over a telephone line using a modem. A modem local to processor 220 can receive the data on the telephone line and use an infrared transmitter to convert the data to an infrared signal. An infrared detector coupled to bus 902 can receive the data carried in the infrared signal and place the data on bus 902. Bus 902 carries the data to main memory 906, from which CPU 904 retrieves and executes the instructions. The instructions received by main memory 906 may optionally be stored on storage device 910 either before or after execution by CPU 904.

Thus, the methodology of the present invention enables CD variations to be quickly mapped for analysis, without affecting the regular inspection procedure. By analyzing the LBMs of a reticle, the user of the present invention can monitor CD error patterns (e.g., global errors and errors of a particular feature size) in ways that are not possible with conventional inspection and/or methodology tools. Furthermore, the generation of the LBMs of the present invention is much faster than measurements using a CD-SEM, and the CD variation information yielded by the LBMs is more comprehensive than that provided by prior art CD-SEMs, since the LBMs plot CD variation for the entire reticle, not only sample sites. Such information can be used to diagnose and correct reticle production problems. Moreover, since the present invention utilizes information gathered by the reticle inspection tool as it scans the entire reticle for defects during the regular inspection procedure, the CD deviation maps are, in essence, provided without cost to the user in terms of time or effort.

The LBMs may also be used to select sites for further detailed inspection by a CD-SEM in a more meaningful way than prior art site selection techniques, since the LBMs provide information relating to every site on the reticle. The LBMs can be viewed, in this regard, as a good "first cut" for CD-SEM inspection site selection, and since the LBMs are made on the fly, there is no time penalty involved. Furthermore, the user can monitor errors that are too small to be practicably detected with conventional inspection methodology, yet are large enough to adversely affect the performance of semiconductor devices produced using the reticle under inspection.

Moreover, the LBMs can be shipped along with the reticle to the user of the reticle; i.e., the wafer fabrication shop, to provide the reticle user with information as to how the reticle should be used to obtain the best results. The fabrication shop can then adjust its process parameters accordingly. For example, if the LBMs for a reticle show a global error of a particular average amount, the fabrication shop can adjust its stepper to compensate for the error, thereby increasing yield and reducing manufacturing costs. The reticle user can also employ the LBMs to determine the extent to which the reticle consumes the user's CD error "budget"; i.e., the amount of allowable CD variation in the finished semiconductor devices. By allowing the user to observe global reticle problems causing CD variation, early corrective action can be taken, thereby enabling the manufacture of devices closer to design specifications. Still further, this LBM data can be fed back to the mask production shop and used to improve successive masks.

The present invention is applicable to the inspection of any photolithographic reticle used in the manufacture of semiconductor devices, and is especially useful for in-process inspection of reticles used in the manufacture of high density semiconductor devices with submicron design features.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of inspecting target patterns formed on a surface of a reticle, which method comprises:
    imaging the target patterns to produce a plurality of target data elements representative of the target patterns, each target data element associated with a respective location on the surface;
    receiving a plurality of reference data elements corresponding to substantially the same respective location on the surface as the target data elements;
    comparing the target data elements with the reference data elements to obtain differences between the target data elements and the corresponding reference data elements;
    calculating the sum of the largest negative magnitude of all the difference values and largest positive magnitude of all the difference values to produce a peak-to-peak difference value;
    comparing the peak-to-peak difference value with a threshold peak-to-peak difference value; and
    generating a graphical display map of substantially all the differences as a function of the locations on the surface associated with the target and the reference data elements from which each respective difference was obtained.

2. The method of claim 1, wherein the patterns include pattern surfaces and edges, each target and reference data element represents at least one of a pattern surface and an edge of one of the patterns, and the comparing step comprises processing the target and reference data elements in a manner corresponding to a predetermined direction in the patterns to measure target and reference pattern widths between two edges;
    wherein the differences are differences between the corresponding target and reference pattern widths.

3. The method of claim 1, further comprising storing all of the differences prior to mapping.

4. The method of claim 2, wherein the target patterns and the corresponding reference patterns each comprise a first plurality of patterns having a first design width and a second plurality of patterns having at least some design widths different from the first design width, and the mapping step comprises mapping only the differences between the first pluralities of target and reference patterns.

5. The method of claim 4, comprising storing the differences between the first pluralities of target and reference patterns separately from the differences between the second pluralities of target and reference patterns prior to mapping.

6. The method of claim 1, wherein the mapping step comprises:
    assigning each difference to be mapped into one of a plurality of groups based on a numerical value of the difference;
    associating a different color with each of the plurality of groups; and
    displaying each difference to be mapped as a data point on a two-dimensional graph in the color of its assigned group, wherein coordinates of the graph represent the location on the surface associated with target and reference data elements from which each respective difference to be mapped was calculated.

7. The method of claim 1, wherein the mapping step comprises displaying each difference to be mapped as a data point on a three-dimensional graph having an x-axis, a y-axis and a z-axis, wherein the x and y axes of the graph represent the location on the surface associated with target and reference data elements from which each respective difference to be mapped was calculated, and the z-axis represents a numerical value of the difference.

8. The method of claim 3, wherein the surface is a reticle used in manufacturing semiconductor devices, and wherein each of the differences is expressed as a positive value or a negative value, the method further comprising:
    disqualifying the reticle if the peak-to-peak difference value is greater than the threshold peak-to-peak difference value.

9. The method of claim 2, wherein the predetermined direction in the patterns comprises a horizontal direction, vertical direction, slash direction or backslash direction.

10. The method of claim 1, wherein the reference data elements are received from a substantially defectless reference design database.

11. The method of claim 2, comprising:
    measuring a plurality of the target pattern widths;
    calculating an average of the plurality of target pattern widths; and
    using the average as the target data element in the comparing step.

12. The method of claim 2, comprising comparing the differences to a predetermined maximum difference value, wherein the mapping step comprises mapping only the differences less than or equal to the maximum difference value.

13. A computer-readable medium bearing instructions for inspecting target patterns formed on a surface of a reticle, said instructions, when executed, being arranged to cause one or more processors to perform the steps of:
    controlling an imager to image the target patterns to produce a plurality of target data elements representative of the target patterns, each target data element associated with a respective location on the surface;

receiving a plurality of reference data elements corresponding to substantially the same respective location on the surface as the target data elements;

comparing the target data elements with the reference data elements to obtain differences between the target data elements and the corresponding reference data elements;

calculating the sum of the largest negative magnitude of all the difference values and largest positive magnitude of all the difference values to produce a peak-to-peak difference value;

comparing the peak-to-peak difference value with a threshold peak-to-peak difference value; and generating a graphical display map of substantially all the differences as a function of the locations on the surface associated with the target and the reference data elements from which each respective difference was obtained.

14. The computer-readable medium according to claim 13, wherein the patterns include pattern surfaces and edges, and each target and reference data element represents at least one of a pattern surface and an edge of one of the patterns;

wherein the instructions, when executed, are arranged to cause the one or more processors to compare the target and reference data elements by processing the target and reference data elements in a manner corresponding to a predetermined direction in the patterns to measure target and reference pattern widths between two edges; and wherein the differences are differences between the corresponding target and reference pattern widths.

15. The computer-readable medium according to claim 14, wherein the instructions, when executed, are arranged to cause the one or more processors to store all of the differences prior to mapping.

16. The computer-readable medium according to claim 14, wherein the target patterns and the corresponding reference patterns each comprise a first plurality of patterns having a first design width and a second plurality of patterns having at least some design widths different from the first design width; and wherein the instructions, when executed, are arranged to cause the one or more processors to map only the differences between the first pluralities of target and reference patterns.

17. The computer-readable medium according to claim 16, wherein the instructions, when executed, are arranged to cause the one or more processors to store the differences between the first pluralities of target and reference patterns separately from the differences between the second pluralities of target and reference patterns prior to mapping.

18. The computer-readable medium according to claim 13, wherein the instructions, when executed, are arranged to cause the one or more processors to map the differences by:

assigning each difference to be mapped into one of a plurality of groups based on a numerical value of the difference;

associating a different color with each of the plurality of groups; and displaying each difference to be mapped as a data point on a two-dimensional graph in the color of its assigned group, wherein coordinates of the graph represent the location on the surface associated with target and reference data elements from which each respective difference to be mapped was calculated.

19. The computer-readable medium according to claim 13, wherein the instructions, when executed, are arranged to cause the one or more processors to map the differences by displaying each difference to be mapped as a data point on a three-dimensional graph having an x-axis, a y-axis and a z-axis, wherein the x and y axes of the graph represent the location on the surface associated with target and reference data elements from which each respective difference to be mapped was calculated, and the z-axis represents a numerical value of the difference.

20. The computer-readable medium according to claim 14, wherein the instructions, when executed, are arranged to cause the one or more processors to perform the step of:

disqualifying the reticle if the peak-to-peak difference value is greater than the threshold peak-to-peak difference value.

21. The computer-readable medium according to claim 14, wherein the predetermined direction in the patterns comprises a horizontal direction, vertical direction, slash direction or backslash direction.

22. The computer-readable medium according to claim 13, wherein the instructions, when executed, are arranged to cause the one or more processors to receive the reference data elements from a substantially defectless reference design database.

23. The computer-readable medium according to claim 14, wherein the instructions, when executed, are arranged to cause the one or more processors to perform the steps of:

measuring a plurality of the target pattern widths;

calculating an average of the plurality of target pattern widths; and using the average as the target data element in the comparing step.

24. The computer-readable medium according to claim 14, wherein the instructions, when executed, are arranged to cause the one or more processors to compare the differences to a predetermined maximum difference value and to map only the differences less than or equal to the maximum difference value.

25. An inspection tool for inspecting target patterns formed on a surface of a reticle, the inspection tool comprising:

an imager for imaging the target patterns to produce a plurality of target data elements representative of the target patterns, each target data element associated with a respective location on the surface;

a processor for receiving a plurality of reference data elements corresponding to substantially the same respective location on the surface as the target data elements;

a comparator for comparing the target data elements with the reference data elements to obtain substantially all differences between the target data elements and the corresponding reference data elements, wherein the processor is configured to calculate the sum of the largest negative magnitude of all the difference values and largest positive magnitude of all the difference values to produce a peak-to-peak difference value;

compare the peak-to-peak difference value with a threshold peak-to-peak difference value; and generate a graphical display map of substantially all the differences as a function of the locations on the surface associated with the target and the reference data elements from which each respective difference was obtained.

26. The inspection tool of claim 25, wherein the patterns include pattern surfaces and edges, and each target and reference data element represents at least one of a pattern surface and an edge of one of the patterns;

the processor is further configured to process the target and reference data elements in a manner corresponding to a predetermined direction in the patterns to measure target and reference pattern widths between two edges; and the comparator is further configured to obtain the differences between corresponding target and reference pattern widths.

27. The inspection tool of claim 25, further comprising a storage device for storing all of the differences.

28. The inspection tool of claim 26, wherein the target patterns and the corresponding reference patterns each comprise a first plurality of patterns having a first design width and a second plurality of patterns having at least some design widths different from the first design width, and the processor is further configured to map only the differences between the first pluralities of target and reference patterns.

29. The inspection tool of claim 28, wherein the storage device is further configured to store the differences between the first pluralities of target and reference patterns separately from the differences between the second pluralities of target and reference patterns.

30. The inspection tool of claim 25, further comprising a monitor for displaying the results of mapping.

31. The inspection tool of claim 30, wherein the processor is further configured to:
assign each difference to be mapped into one of a plurality of groups based on a numerical value of the difference;
associate a different color with each of the plurality of groups; and
cause the monitor to display each difference to be mapped as a data point on a two-dimensional graph in the color of its assigned group, wherein coordinates of the graph represent the location on the surface associated with target and reference data elements from which each respective difference to be mapped was calculated.

32. The inspection tool of claim 30, wherein the processor is further configured to cause the monitor to display each difference to be mapped as a data point on a three-dimensional graph having an x-axis, a y-axis and a z-axis, wherein the x and y axes of the graph represent the location on the surface associated with target and reference data elements from which each respective difference to be mapped was calculated, and the z-axis represents a numerical value of the difference.

33. The inspection tool of claim 26, wherein the surface is a reticle used in manufacturing semiconductor devices, and wherein each of the differences is expressed as a positive value or a negative value, wherein the processor is further configured to:
disqualify the reticle if the peak-to-peak difference value is greater than the threshold peak-to-peak difference value.

34. The inspection tool of claim 25, wherein the predetermined direction in the patterns comprises a horizontal direction, a vertical direction, a slash direction, and a backslash direction.

35. The inspection tool of claim 25, wherein the processor is further configured to receive the reference data elements from a substantially defectless reference design database.

36. The inspection tool of claim 25, wherein the processor is further configured to:
measure a plurality of the target pattern widths; and
calculate an average of the plurality of target pattern widths;
wherein the comparator is further configured to use the average as the target data element in the comparing step.

37. The inspection tool of claim 25, wherein the comparator is further configured to compare the differences to a predetermined maximum difference value, and the processor is further configured to map only the differences less than or equal to the maximum difference value.

* * * * *